(12) United States Patent
Forbes et al.

(10) Patent No.: US 7,214,616 B2
(45) Date of Patent: May 8, 2007

(54) HOMOJUNCTION SEMICONDUCTOR DEVICES WITH LOW BARRIER TUNNEL OXIDE CONTACTS

(75) Inventors: Leonard Forbes, Corvallis, OR (US); Kie Y. Ahn, Chappaqua, NY (US)

(73) Assignee: Micron Technology, Inc., Boise, ID (US)

(*) Notice: Subject to any disclaimer, the term of this patent is extended or adjusted under 35 U.S.C. 154(b) by 391 days.

(21) Appl. No.: 09/795,949

(22) Filed: Feb. 28, 2001

(65) Prior Publication Data

US 2001/0010389 A1 Aug. 2, 2001

Related U.S. Application Data

(62) Division of application No. 09/257,466, filed on Feb. 24, 1999, now Pat. No. 6,211,562.

(51) Int. Cl.
*H01L 21/44* (2006.01)

(52) U.S. Cl. ........................ 438/672; 438/309
(58) Field of Classification Search ........... 257/173, 257/577, 356, 357, 362, 565, 588, 587, 514, 257/515, 517, 518, 151; 438/309, 312, 317, 438/364, 672
See application file for complete search history.

(56) References Cited

U.S. PATENT DOCUMENTS

| 3,755,026 A | 8/1973 | Reynolds ............... 156/17 |
| 5,006,912 A | 4/1991 | Smith et al. ........... 357/34 |
| 5,086,016 A * | 2/1992 | Brodsky et al. ........ 438/369 |
| 5,346,840 A | 9/1994 | Fujioka ................ 437/31 |
| 5,389,803 A | 2/1995 | Mohammad ........... 257/197 |
| 5,486,704 A * | 1/1996 | Morishita .............. 257/9 |
| 5,512,785 A | 4/1996 | Haver et al. ........... 257/758 |
| 5,600,177 A | 2/1997 | Yamazaki .............. 257/588 |
| 5,656,514 A | 8/1997 | Ahlgren et al. ........ 438/320 |
| 5,702,281 A * | 12/1997 | Huang et al. .......... 445/50 |
| 5,886,395 A | 3/1999 | Katsumata et al. ..... 257/585 |
| 5,925,975 A * | 7/1999 | Suzuki ................. 313/336 |
| 6,284,581 B1 * | 9/2001 | Pan et al. ............. 438/202 |
| 6,329,699 B2 * | 12/2001 | Kitahata .............. 257/588 |
| 6,433,428 B1 * | 8/2002 | Watanabe et al. ...... 257/750 |

FOREIGN PATENT DOCUMENTS

JP 406231679 A * 8/1994

OTHER PUBLICATIONS

S.M. Sze, Semiconductor Devices, Physics and Technology 1985, John Wiley & Sons, pp. 144 and 145.*
Sze, S. M., Semiconductor Devices, Physics and Technology, John Wiley & Sons, pp. 144-147.*

(Continued)

*Primary Examiner*—B. William Baumeister
*Assistant Examiner*—Dana Farahani
(74) *Attorney, Agent, or Firm*—Schwegman, Lundberg, Woessner & Kluth, P.A.

(57) ABSTRACT

A homojunction bipolar transistor with performance characteristics similar to more costly heterojunction or retrograde base transistors. The high emitter resistivity found in prior homojunction devices is circumvented using a low work function material layer in forming the emitter. This produces an economically viable high performance alternative to SiGe HBTs or SiGe retrograde base transistors.

11 Claims, 6 Drawing Sheets

OTHER PUBLICATIONS

Iyer, S.S., et al., "Heterojunction Bipolar Transistors Using Si-Ge Alloys", *IEEE*, pp. 2043-2064, (1989).

Janega, P.L., et al., "Contact resistivity of some magnesium/silicon and magnesium silicide/silicon structures", *Applied Physics Letter*, 53 (21), pp. 2056-2058, (Nov. 1988).

Janega, P.L., et al., "Extremely low resistivity erbium ohmic contacts to n-type silicon", *Applied Physics Letter*, 55 (14), pp. 1415-1417, (Oct. 1989).

Kaltsas, G., et al., "Erbium silicide films on (100) silicon, grown in high vacuum. Fabrication and properties", *Thin Solid Films*, 275, pp. 87-90, (1996).

Meyerson, B.S., et al., "High-Speed Silicon-Germanium Electronics", *Scientific American*, pp. 62-67, (Mar. 1994).

Ng, K.K., et al., "Asymmetry in SiO2 tunneling barriers to electrons and holes", *J. Appl. Phys.*, 51(4), pp. 2153-2157, (Apr. 1980).

Sundaram, K.B., et al., "Work function determination of zinc oxide films", *Journal of Vacuum Science & Technology A, Vacuum, Surfaces, and Films*, pp. 428-430, (1996).

Sze, S.M., *In: Physics of Semiconductor Devices*, John Wiley & Sons, Inc., p. 291, (1981).

Sze, S.M., "Ohmic Contact", *In: Physics of Semiconductor Devices, Second Edition*, Johm Wiley & Sons, Inc., pp. 304-305, (1981).

Sze, S.M., "Schottky Effect", *In: Physics of Semiconductor Devices*, John Wiley & Sons , Inc., p. 251, (1981).

Walczyk, F., et al., "Tailoring Interfacial Oxide for Polysilicon Bit-Cell Contacts and Emitters with In Situ Vapor HF Interface Cleaning and Polysilicon Deposition in a 4Mbit BiCMOS Fast Static RAM", *IEEE Bipolar Circuits and Technology Meeting*, 84-87, (1992).

Wang, C.C., et al., "Review. Electrical properties of high-temperature oxides, borides, carbides, and nitrides", *Journal of Materials Science*, 30, pp. 1627-1641, (1995).

Yu, Z., et al., "A Comprehensive Analytical and Numerical Model of Polysilicon Emitter Contacts in Bipolar Transistors", *IEEE Transactions on Electron Devices*, ED-31 (6), pp. 773-784, (Jun. 1984).

*The Handbook of Binary Phase Diagrams*, 4, Genium Publishing, results summarized from the Constitution of Binary Alloys, pp. 916-919, 1985; First Supplement to Constitution of Binary Alloys, pp. 508-509, 1985; Second Supplement to Constitution of Binar Alloys, pp. 494-495, 1985, 10 pages, (1987).

Bose, S., et al., "Electrocal, thermal, thermoelectric and related properties of magnesium silicide semiconductor prepared from rice husk", *Journal of Materials Science*, 28, pp. 5461-5468, (1993).

Chor, E.F., et al., "Emitter Resistance of Arsenic- and Phosphorus-Doped Polysilicon Emitter Transistors", *IEEE Trans. on Electron Devices*, 6(10), pp. 516-518, (Oct. 1985).

Deal, B., et al., "Barrier Energies in Metal-Silicon Dioxide-Silicon Structures", *J. Phys. Chem. Solids*, 27, pp. 1873-1879 (1966).

Gordon, R.G., "Recent Advances In The CVD Of Metal Nitrides And Oxides", *Metal-Organic Chemical Vapor Deposition of Electronic Ceramics*, 335, Materials Research Society, Pittsburgh, Pennsylvania, pp. 9-19, (1994).

Horie, H., et al., "Novel High Aspect Ratio Aluminum Plug for Logic/DRAM LSI's Using Polysilicon-Aluminum Substitute", *Technical Digest: IEEE International Electron Devices Meeting*, San Francisco, CA, 946-948, (1996).

\* cited by examiner

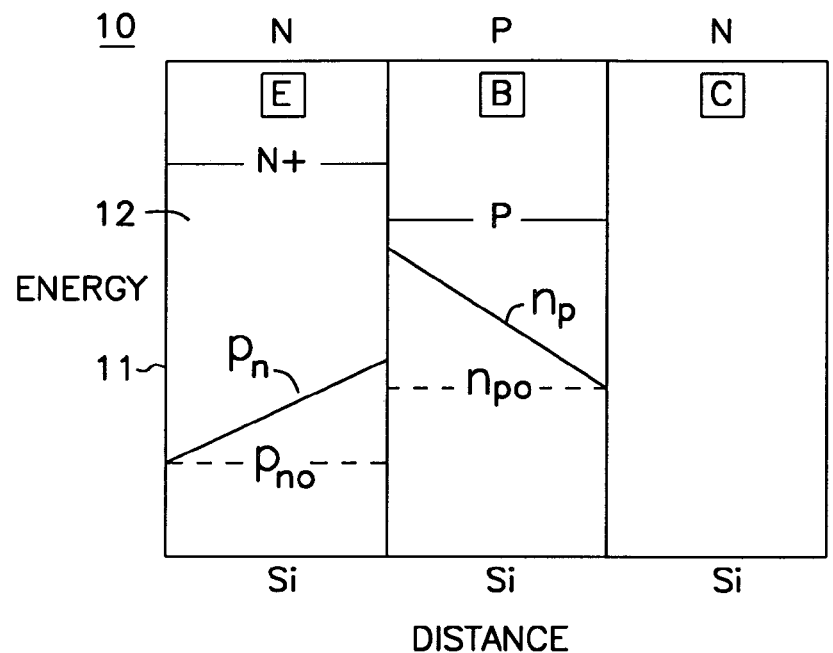
FIG. 1A (REFERENCE ART)
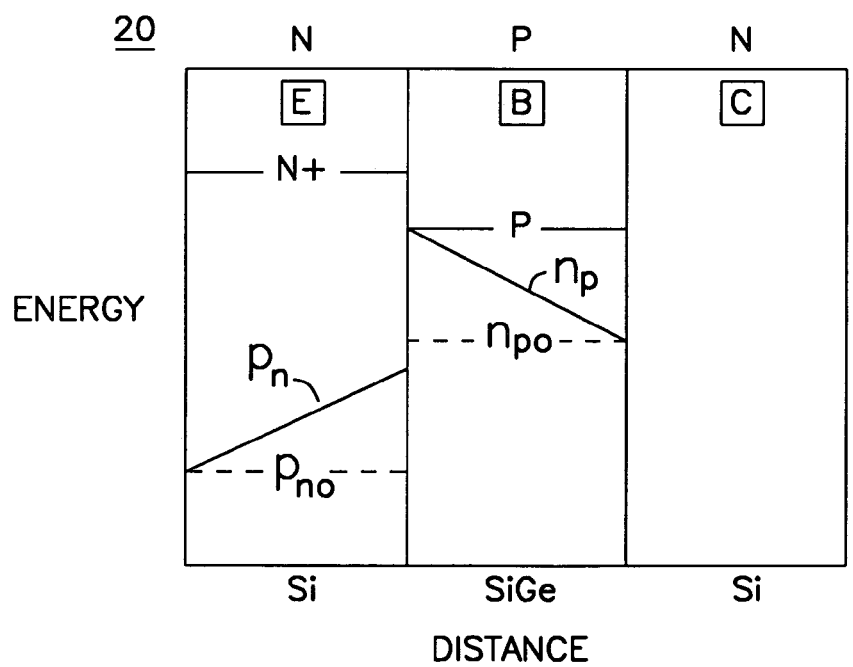
FIG. 1B (REFERENCE ART)

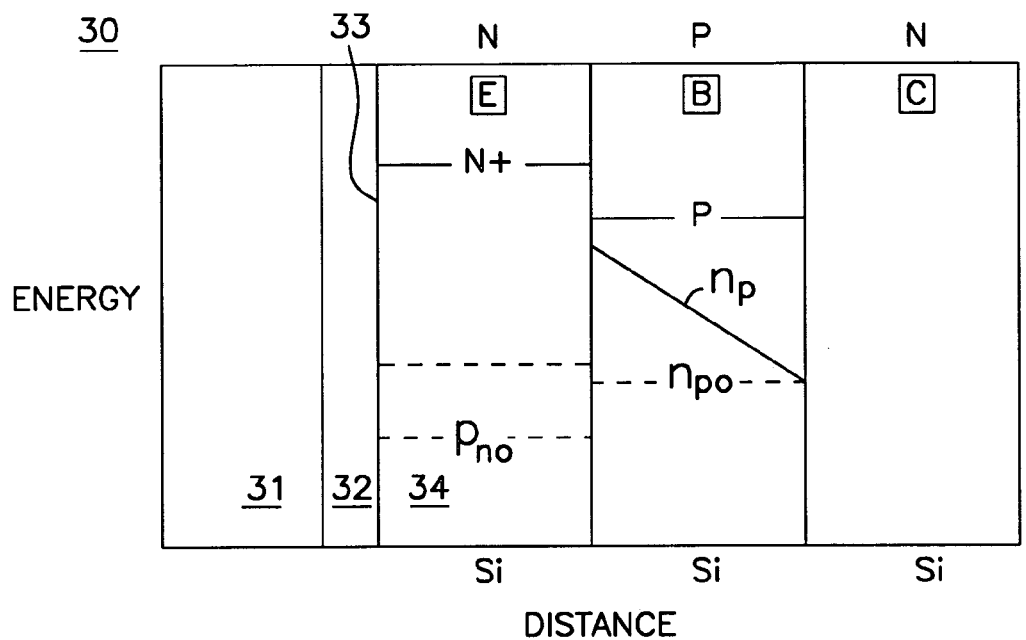
FIG. 1C (REFERENCE ART)
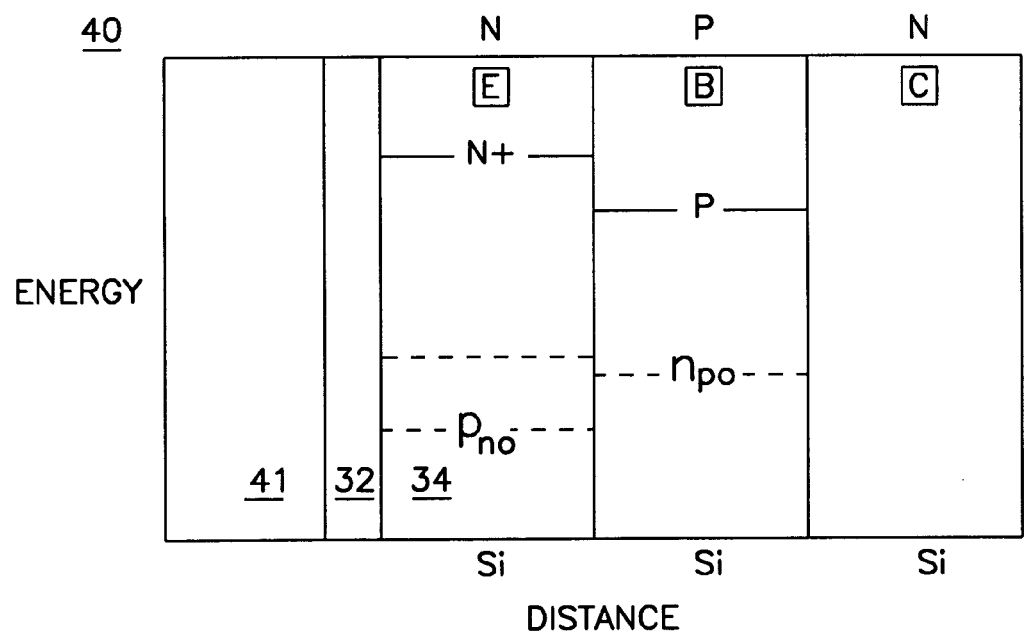
FIG. 2

HOMOJUNCTION SEMICONDUCTOR DEVICES WITH LOW BARRIER TUNNEL OXIDE CONTACTS

This application is a divisional of U.S. patent application Ser. No. 09/257,466, filed on Feb. 24, 1999, now U.S. Pat. No. 6,211,562.

TECHNICAL FIELD OF THE INVENTION

The present invention relates generally to semiconductor devices and in particular to homojunction semiconductor devices with low barrier tunnel oxide contacts.

BACKGROUND

Integrated circuit technology relies on transistors to formulate vast arrays of functional circuits. The complexity of these circuits requires the use of an ever increasing number of transistors. And the more transistors, the more the demand for transistors with faster switching times. As the number of transistors required increases, the total power consumption, the response time and the cost of the circuit also increase. It is desirable then to construct inexpensive transistors which are faster yet more efficient in terms of current gain and switching time.

Silicon has been a standard material for manufacturing transistors for many years. Conventionally, silicon technology has made steady strides in semiconductor evolution by relying strongly on dimensional miniaturization or "scaling" to achieve performance increases. However, miniaturization below today's submicrometer dimensions is difficult to achieve and comes at a prohibitive cost. Therefore, many researchers have decided that homojunction transistors, such as silicon, have reached their performance boundaries. Because of this, the main focus of transistor research has been on SiGe (silicon-germanium) graded base transistors or SiGe heterojunction transistors. Researchers have found additional performance in SiGe type transistors but not without increased time and expense in manufacturing. In fact, SiGe heterojunction bipolar transistors (HBT) have not gained acceptance in the industry due to manufacturing difficulties, bandgap discontinuities and spikes at the emitter-base junction. Instead, graded base SiGe transistors have dominated the current transistor market.

A typical bipolar transistor has a collector, a base and an emitter. When the transistor is activated, a small current is injected into the base of the transistor. The applied bias lowers a constant, built-in energy barrier that blocks the flow of electrons. As the barrier drops, current begins to pass through the transistor, and the device switches to an ON state. The amount of current moving through the device is proportional to, but much larger than, the amount injected into the base. The built-in barrier is created by introducing specific impurities, or dopant atoms, into the silicon when the transistor is fabricated. Doped silicon is known as n-type silicon if it contains an excess of negative charges or p-type silicon if positive charges prevail. The function of a bipolar transistor depends on the electrical properties at the interface between n-type and p-type silicon. An interface between two regions of semiconductor having the same basic composition-silicon, but opposing types of doping is called a homojunction. The joining of two dissimilar materials is known as a heterojunction.

The collector and base of the transistor are normally constructed using doped semiconductor materials. The emitter is usually constructed of a semiconductor material such as n+ polysilicon. However, a polysilicon emitter with controlled oxides has a high emitter resistance and works well only at low current levels. At high current levels, the emitter resistance results in a reduction of the effective transconductance. This causes inefficient power consumption and requires more heat dissipation due to the higher series resistance. Metal emitters have been proposed to overcome deficiencies in heterojunction type bipolar transistors. The proposed metal emitters, however, do not contain a semiconductor layer acting as an emitter.

FIG. 1A illustrates the basic problems with modern bipolar transistors 10. Shallow emitter junctions and high surface recombination velocities at the emitter surface 11, result in a large injection current into the emitter 12, low injection efficiencies and consequently low current gain, "beta", and lower power gain at high frequencies. One method of resolving these deficiencies involves reducing the series resistive value of the transistor. This can be accomplished by increasing the transistor's injection efficiency. For example, as shown in FIG. 1B, to overcome the high emitter resistance, a SiGe base HBT 20 can be constructed. This allows for a smaller bandgap material ($n_{po}$ of SiGe is greater than $n_{po}$ of Si, where $n_{po}$ is the electron thermal equilibrium concentration in a p-doped material) to be used for the base which results in a higher injection efficiency [i.e., $n_{po}/(n_{po}+p_{no})$, where $P_{no}$ is the hole thermal equilibrium concentration in an n-doped material]. It is evident from the equation that the efficiency increases when the electron equilibrium concentration becomes increasingly larger than the hole equilibrium concentration. However, SiGe HBT transistor technology has not been proven to be economical nor feasible for actual production.

Higher injection efficiencies in bipolar transistors 30 can also be obtained by using an n+ polysilicon emitter contact 31 with a controlled oxide 32 as shown in FIG. 1C. This type of transistor can have high current gain, since the surface recombination velocity at the emitter surface 33 is low. However, the resistance of the emitter 34 is also higher due to the high tunneling barrier height. Another method involves using graded base SiGe transistors. Here, a retrograde Ge concentration is used in the base to create a built-in field which reduces base transit time. However, the complexity and cost of the transistor manufacturing are increased due to the process required to fabricate the graded base material.

Accordingly, what is needed is an inexpensive, easily manufacturable bipolar transistor with an emitter contact having a low tunneling barrier height or "work function". A transistor with such an emitter would have reduced resistivity and, thus, high current gain and fast switching speeds.

SUMMARY

The present invention provides a means and apparatus for establishing a low work function contact for a homojunction semiconductor device. For example, a homojunction bipolar transistor can be provided with performance characteristics rivaling heterojunction or graded base transistors. The normal n+ polysilicon emitter contact layer of the homojunction transistor is replaced with a material with a lower tunneling barrier. This creates a transistor with low contact resistance and high gain. Contact material such as aluminum can be applied directly to the low work function material to complete the transistor connections.

This and other embodiments, aspects, advantages and features of the present invention will be set forth in part in the description which follows, and in part will become apparent to those skilled in the art by reference to the following description of the invention and referenced drawings or by practice of the invention. The aspects, advantages and features of the invention are realized and attained by means of the instrumentalities, procedures and combinations particularly pointed out in the appended claims.

BRIEF DESCRIPTION OF THE DRAWINGS

FIG. 1A illustrates an energy barrier diagram for a modern bipolar transistor emitter/base junction.

FIG. 1B illustrates an energy barrier diagram for an SiGe base heterojunction bipolar transistor emitter/base junction.

FIG. 1C illustrates an energy barrier diagram for a homojunction bipolar transistor with a polysilicon emitter.

FIG. 2 illustrates an energy barrier diagram for a homojunction bipolar transistor with a low barrier tunnel oxide emitter contact.

DETAILED DESCRIPTION

In the following detailed description, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that structural, material and electrical changes may be made without departing from the scope of the present invention. The following detailed description is, therefore, not to be taken in a limiting sense, and the scope of the present inventions is defined only by the appended claims.

It is well known that polysilicon emitter bipolar transistors can have a very high current gain when an oxide, even just the native oxide on silicon, is left in the contact holes prior to polysilicon deposition. In fact, it is extremely difficult to remove all oxide from the silicon particularly in small contact holes and make oxide free contacts. Even with "oxide free" processing (in situ vapor HF pre-clean/poly deposition), a thin and discontinuous interfacial oxide can exist. Bit-cell contact resistance ($R_C$) rises as the oxide increases. Therefore, this tunneling oxide must be taken into account in modeling emitter resistance, and the resistance or characteristics depends on the tunneling barrier.

The present invention is an apparatus and method for a creating a low contact resistance semiconductor device such as a homojunction bipolar transistor with a low barrier tunnel emitter contact. As shown in FIG. 2, in one embodiment of the invention 40, a polysilicon contact layer of a homojunction bipolar transistor is replaced with a material 41 with a lower tunneling barrier. This produces a lower emitter contact resistance, $R_C$. The resulting transistor has high gain (or beta) and low contact resistance. This embodiment 40 of the homojunction bipolar transistor possesses performance characteristics similar to an SiGe HBT without requiring complicated and expensive manufacturing techniques. The following detailed description first describes the process of making a transistor with the present invention characteristics, followed by descriptions of various embodiments and an explanation of the physics involved. Lastly, alternative uses of the invention and further embodiments are discussed.

Figure 3A:
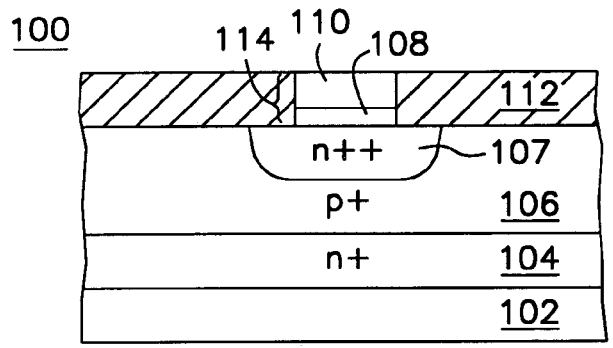
FIGS. 3A–3D illustrate the steps in fabricating one embodiment of the present invention.

FIG. 3A is a representation of a layered wafer 100 grown for one embodiment of the present invention. On an isolating substrate 102, an n silicon collector layer 104 is grown by a conventional epitaxial technique. A silicon base layer 106 can either be grown with a p-type dopant by standard epitaxial techniques or formed by ion implantation of p-type dopants into part of the n-type silicon collector layer. Oxide or other masking insulator layer 112 can be deposited or partly grown and partly deposited and the emitter opening formed by conventional masking and etching techniques. The heavily doped n++ type emitter 107 can be formed by ion implantation and anneal and diffusion using conventional techniques, diffused from a gaseous source, or formed later by diffusion from a polysilicon or other solid source through a thin oxide layer 108 grown in the opening. If they are not already present as part of the transistor fabrication the next is to grow the silicon oxide layer 108 and deposit an n+ polysilicon layer 110 to form the emitter contact plug.

Figure 3B:
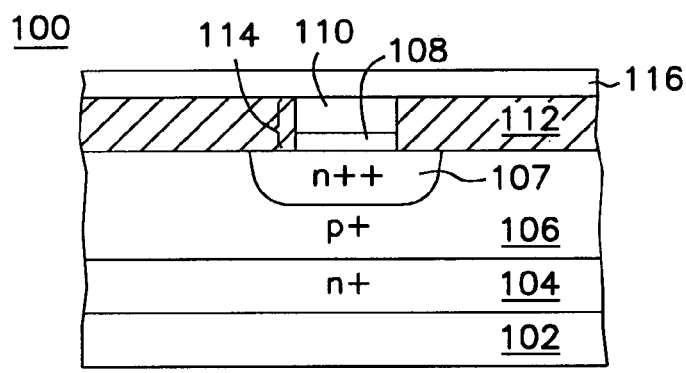
Figure 3C:
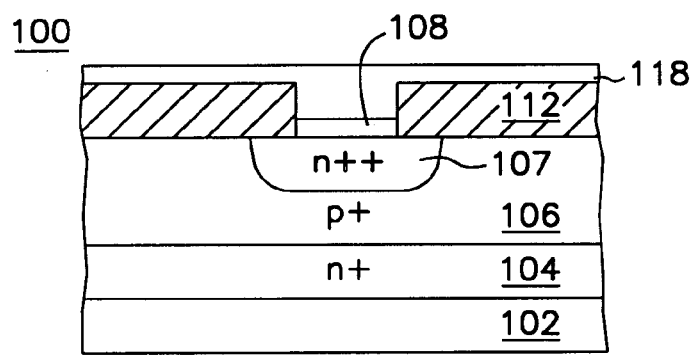
Figure 3D:
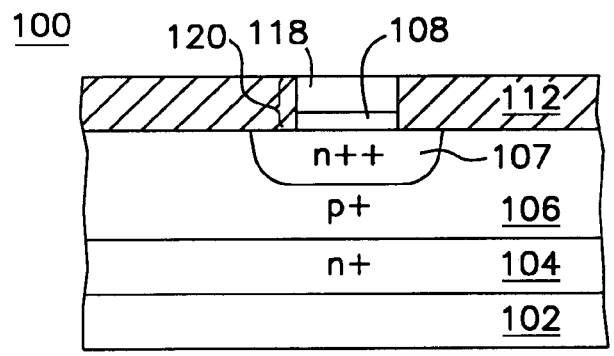

Referring to FIG. 3B, a thick magnesium layer 116 is deposited by physical vapor deposition over the mask 112 and the emitter contact plug 114. The wafer 100 is then heated to a temperature above 638.6 degrees Celsius, causing liquid magnesium and magnesium silicide to form. Upon cooling, as shown in FIG. 3C, a magnesium metal and magnesium silicide mixture 118 will form. If the volume of the magnesium used is large, the percentage of the magnesium suicides will be small after heating. The conductivity of the magnesium metal is much higher than polysilicon. The residual magnesium silicides reduce the conductivity only in the relation to their percentage volume, so the series resistance of the mixture will still be much lower than polysilicon. The excess material from the top of the wafer 100 is then removed by a planarization type process such as Chemical-Mechanical Planarization (CMP) or Mechanical Planarization (MP). After the planarization process is completed, a low work function emitter contact plug 120 is formed as shown in FIG. 3D.

In another alternative embodiment, n-type polysilicon crystalline SiC is used in place of the n-type polysilicon to dope the emitter and left in place. This process requires higher temperatures or the use of plasma enhanced processing to achieve lower temperature processing. Because of these factors, the magnesium process is simpler and normally accomplished at lower temperatures.

In yet another embodiment, a polysilicon-aluminum substitution is used to replace the polysilicon emitter contact with aluminum. The aluminum is then selectively etched out with phosphoric acid and low work function metal oxides or nitrides are deposited as the contact material. The benefit of using this process is that the aluminum etchant does not affect the oxide layer. Attempting to directly etch out a polysilicon layer without first substituting the aluminum, would result in the oxide layer also being etched. This process is more involved than the magnesium method but simpler to accomplish than the SiC processing. H. Horie et al., *Novel High Aspect Ratio Aluminum Plug for Logic/DRAM LSIs Using Polysilicon-Aluminum Substitute*, Dig.

IEEE Int. Electron Device Meeting, San Francisco, pp. 946–948, 1996, details the substitution process and is hereby incorporated by reference.

Figure 4:
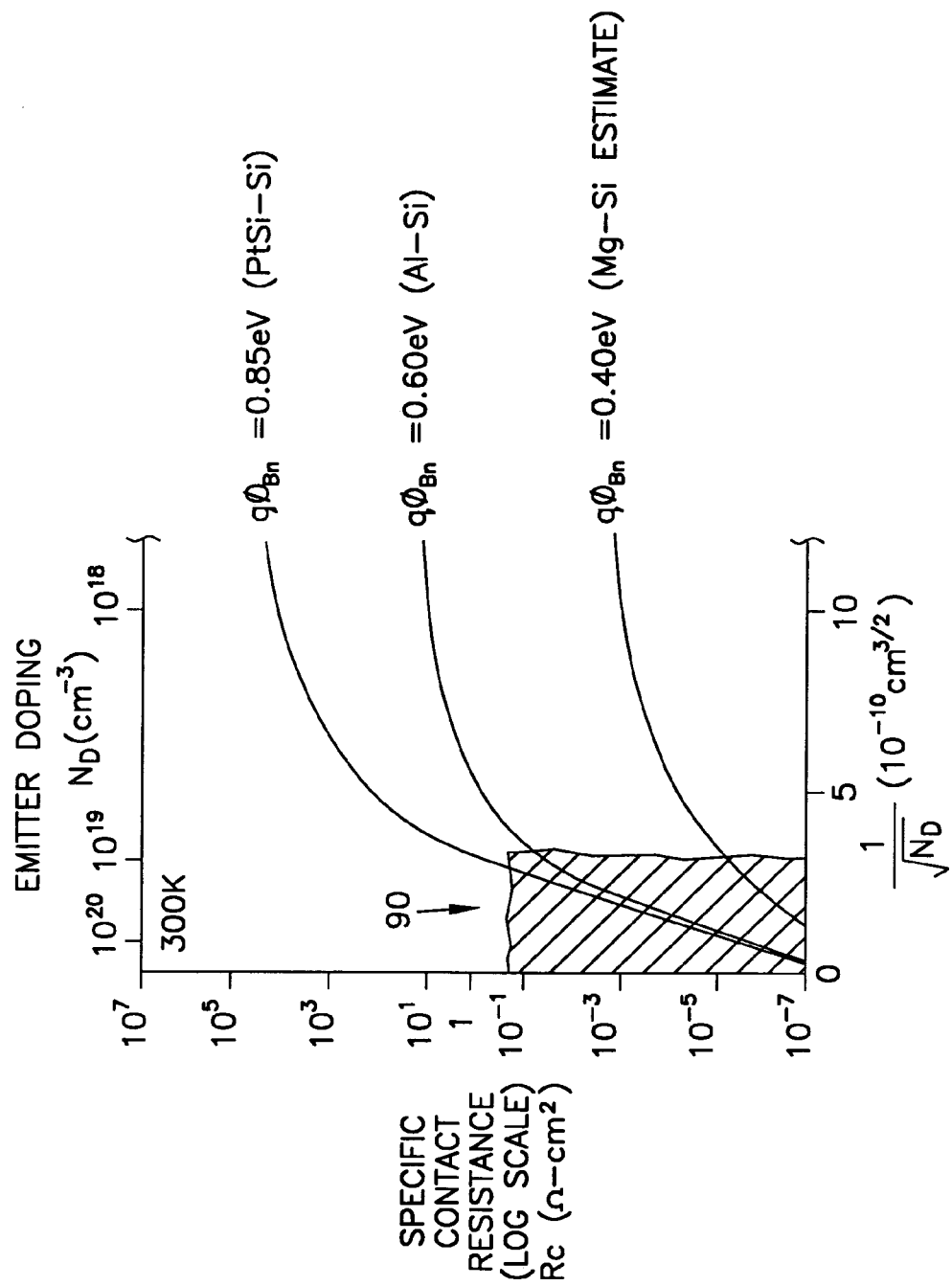
FIG. 4 illustrates the work function, resistivity and doping combination requirements.

As shown in FIG. 4, the magnesium-silicide emitter contact material has a very low work function (0.40 eV) compared to polysilicon emitter contact material (0.85 eV). "Work function" is the amount of work (in electron-volts) required to overcome the inherent barrier to the flow of electrons in a given material. The work function value can be used to gauge the resistance of a particular material to current flow. Magnesium-silicide has a much lower tunnel barrier height (resistivity) than polysilicon. To reduce resistivity and create an ohmic contact, a high doping concentration, a low work function or both is necessary. An ohmic contact is a contact that has a negligible contact resistance relative to the bulk or spreading resistance of the semiconductor. A good ohmic contact does not significantly affect device performance, and it can supply the required current with a voltage drop that is sufficiently small compared with the drop across the active region of the device.

Figure 5:
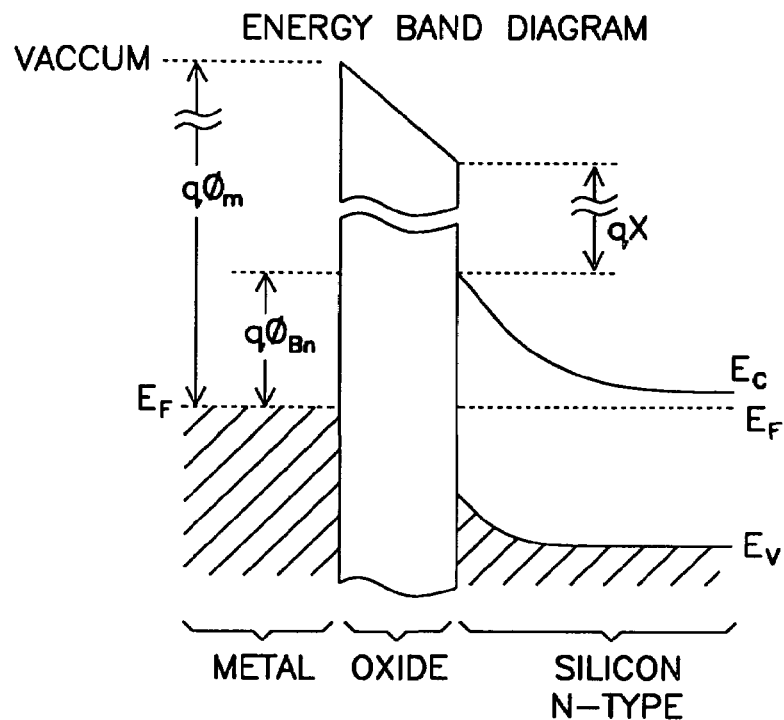
FIG. 5 shows a energy band diagram of one embodiment of the present invention.

The fundamental equations for deriving contact resistance are found in S. Sze, *Physics of Semiconductor Devices*, pp. 304–305, John Wiley and Sons, N.Y., N.Y., 1981, which is incorporated herein by reference. FIG. 5 shows the energy band diagram for npn metal-oxide-silicon layered devices. The work function of the semiconductor barrier height for electrons is the difference between the point where the conduction band energy intersects the boundary of the oxide and the Fermi energy level. The tunneling current is proportional to the exponential value of the negative work function of the semiconductor barrier height for electrons divided by the energy.

$$J \propto e^{(-q\Phi_{Bn}/E_{oo})}$$

The contact resistance is proportional to the exponential value of the work function of the semiconductor barrier height for electrons divided by the energy.

$$R_c \propto e^{\left(\frac{q\Phi_{Bn}}{E_{oo}}\right)}$$

The energy can be defined in terms of the doping concentration.

$$E_{oo} = \frac{q\hbar}{2}\sqrt{\frac{N_D}{\epsilon_s m^*}}$$

Substituting for the energy, the specific contact resistance becomes an exponential function of the barrier height and the reciprocal of the square root of the doping.

$$R_c \propto e^{\left(\frac{q\Phi_{Bn}}{E_{oo}}\right)} = e^{\left[\frac{2\sqrt{\epsilon_s m^*}}{\hbar}\left(\frac{\Phi_{Bn}}{\sqrt{N_D}}\right)\right]}$$

Smaller barrier heights and higher emitter dopings result in lower specific contact resistances when the tunneling current is the dominant conduction mechanism. Referring to FIG. 4, it can be seen that when $N_D \geq 10^{19}$ cm$^{-3}$, the tunneling process dominates in the shaded region 90. The shaded region 90 is an approximate representation of a region and is not meant to definitively define exacting border limitations. Contrastingly, when $N_D \leq 10^{17}$ cm$^{-3}$, the current due to the thermionic emission and contact resistance is essentially independent of the doping. Thus, reducing the work function in highly doped homojunction semiconductor devices, creates faster devices by reducing the contact resistance.

Figure 6:
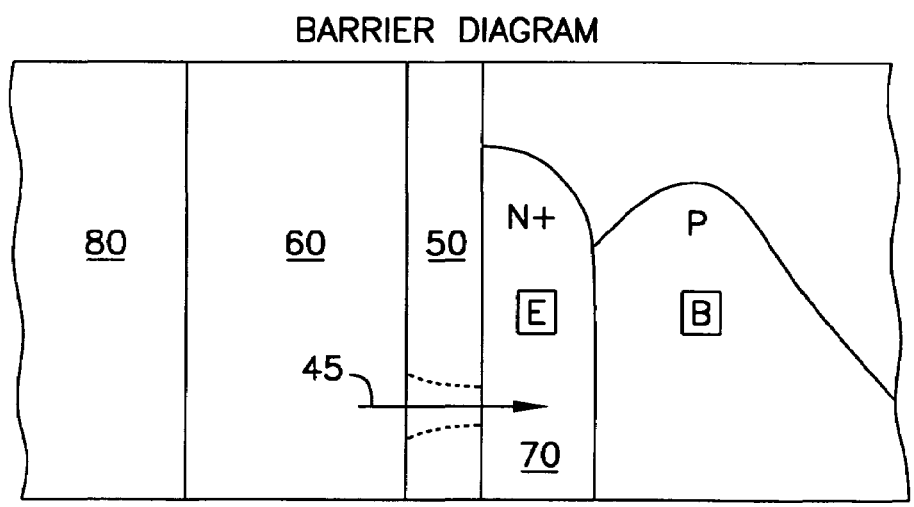
FIG. 6 depicts electrons tunneling through surface oxide of one embodiment of the present invention.

The electrons 45 tunnel through the low oxide barrier 50 between the low work function material 60 and the emitter 70 as shown in FIG. 6. The representation of the electrons tunneling through the oxide barrier 50 in FIG. 6 is a figurative illustration rather than a literal depiction of actual tunneling. A connecting material 80 is also shown interfacing with the low work function material 60. The connecting material 80 is normally made of metal such as aluminum. Unlike previous schemes using metallic emitters in heterojunction transistors, the emitter 70 in the present invention is a normal n+ semiconductor region. The oxide 50 on the surface of the emitter 70 serves to reduce recombination in the emitter 70 and injection into the emitter 70 resulting in a high injection efficiency and common emitter current gain or "beta".

The common contact materials to silicon, aluminum and n+ polysilicon, have basically the same and relatively large work functions of 4.2 eV and barriers with silicon oxide of 3.2 eV. However, when negative charges are brought near a metal surface, positive (image) charges are induced in the metal. When this image force is combined with an applied electric field, the effective work function is reduced. This barrier lowering is called the Schottky effect and, thus, Schottky barrier values are used in describing potential barriers arising in metal-to-semiconductor contacts. The Schottky barrier between aluminum and n-type silicon is 0.7 eV, while metals with a low work function such as magnesium (3.6 eV) have much lower Schottky barriers of around 0.4 eV. The contact resistivity of Mg and Mg$_2$Si contacts to Si were reported to have one of the lowest among the known contacts to n-Si (see generally—P. L. Janega et al, *Contact Resistivity of some Magnesium/Silicon and Magnesium Silicide/Silicon Structures*, Appl. Phys. Lett., vol. 53, no. 21, pp. 2056–8, 1988). The resistivity of metallic Mg is relatively low (4.6 μΩ-cm), while that of silicide is 35 Ω-cm. These are both much lower than polysilicon, so series resistance between the tunneling contact and wiring on the wafer surface is not a substantial problem. Other metals with low work functions like Er, 3.2 eV, are also possible and give Schottky barriers of approximately 0.37 eV. Rare earth silicides also have low Schottky barrier heights to n-type silicon of around 0.3 eV, while transition metal silicides have Schottky barrier energies of 0.5 to 0.6 eV.

Alternatively, metallic oxides and metallic nitrides can be used as the low work function contact material. These have a low work function by virtue of having a large band gap energy. The oxides may be doped, but the nitrides are highly conductive as deposited and include, but are not limited to, TiN, BN and RuO. ZnO can also be used which has a Schottky barrier height of 0.45 eV with n-type silicon. Some carbides will have large bandgaps and low barrier heights with silicon and can be doped to be conductive, most notably SiC. In fact, the whole transistor structure can be formed using n-type SiC rather than n-type polysilicon, the n-type SiC can be used to dope the emitter n-type by diffusion through a native oxide left as the tunneling oxide before the deposition of polycrystalline SiC. It has a large bandgap and low work function when doped n-type.

The present invention results in an emitter structure with a very high injection efficiency but one in which low series resistance is preserved, unlike aluminum contacts with tunneling contacts which have high series resistance. This structure can be utilized in two different manners. First, the high injection efficiency provided by the oxide on the emitter surface can be utilized to produce very high current gain bipolar transistors. Second, since there is a low surface recombination on the surface, a very low thermal budget can be used to produce very shallow emitter junction depths. This will sacrifice injection efficiency and current gain but will allow a much steeper base doping profile and larger drift field in the base. This will result in reduced base transit times providing frequency performance comparable to SiGe graded base transistors.

Figure 7:
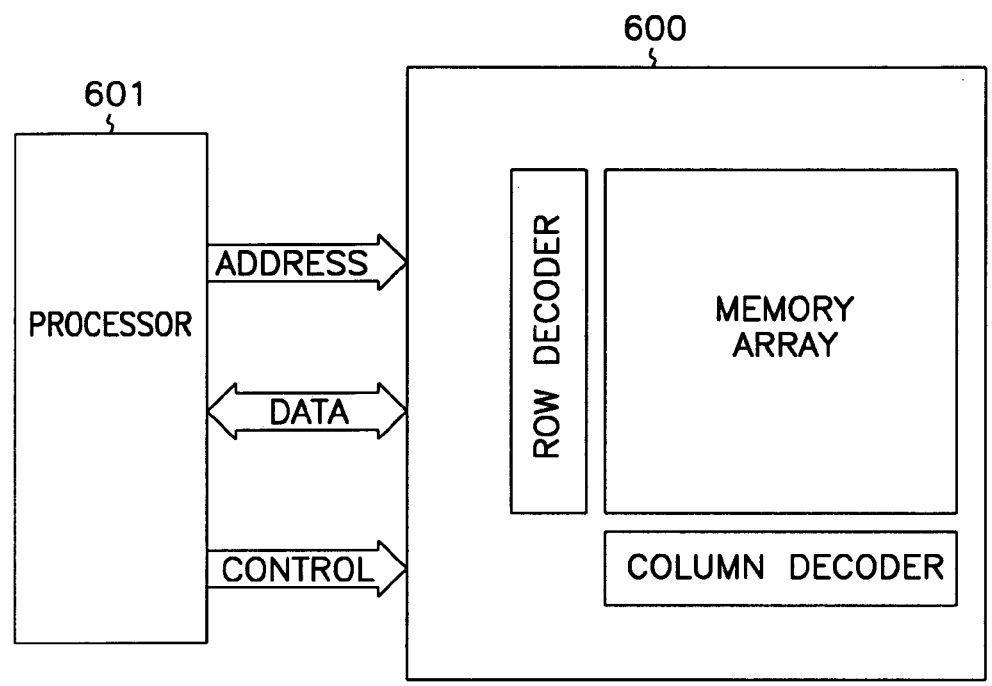
FIG. 7 illustrates a dynamic random access memory device employing an embodiment of the present invention.

A further embodiment of the invention is a semiconductor processor device 601 as shown in FIG. 7 which employs bipolar transistors with low work function material emitter contacts of the present invention. In this representative drawing, a DRAM semiconductor device 600 is interfacing with a processor 601.

Figure 8:
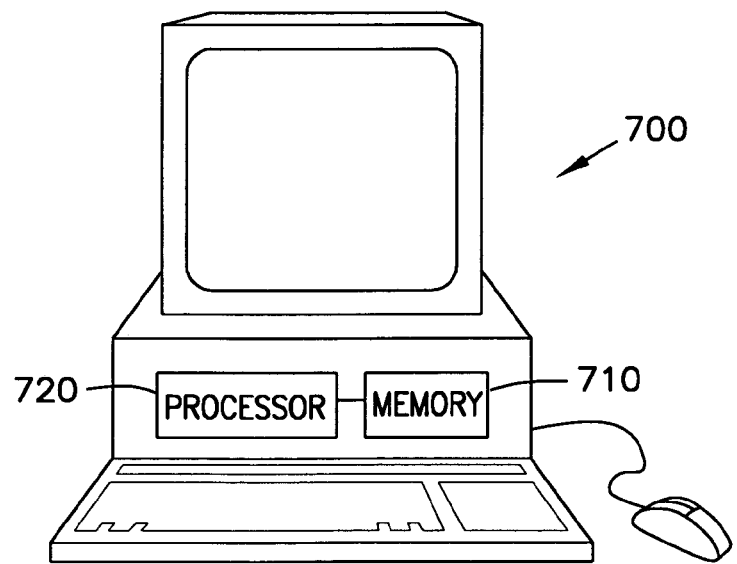
FIG. 8 illustrates an electronic system employing an embodiment of the present invention.

In FIG. 8, yet another embodiment of the present invention is depicted in an electronic system, such as computer system 700, utilizing memory integrated circuits 710, central processing units 720, or other types of integrated circuits employing bipolar transistors with low work function material emitter contacts of the present invention.

CONCLUSION

Although specific embodiments have been illustrated and described herein, it will be appreciated by those skilled in the art that any arrangement which is calculated to achieve the same purpose may be substituted for the specific embodiment of the present invention. This application is intended to cover any adaptations or variations of the present invention.

The present invention can be used whenever a cost effective, high performance device is required. Its performance characteristics make it an excellent choice in computer chips, dynamic random access memory and integrated microchips. Additionally, the invention allows a homojunction device to be used which is less complex and cheaper to manufacture. The fact that a second material such as germanium is not required in the process, allows more of the industry's manufacturers to participate in the high performance bipolar transistor market without heavy investments in new processing equipment. This allows for a more competitive marketplace and reduces the end product costs to the consumer.

What is claimed is:

1. A method of fabricating a semiconductor contact, comprising:
    creating a layer of n-doped silicon;
    forming a silicon oxide layer on the n-doped silicon layer;
    creating an n+ polysilicon layer on the silicon oxide layer;
    forming a contact plug by masking and etching the silicon oxide layer and the n+ polysilicon layer;
    masking the n-doped silicon layer while exposing a top surface of the contact plug;
    depositing a layer of magnesium over the masking and the top surface of the contact plug;
    heating the semiconductor contact to form liquid magnesium;
    cooling the semiconductor contact; and
    planarizing the semiconductor contact to remove the magnesium above a top surface level of the mask.

2. A method of fabricating a semiconductor device, comprising:
    creating an isolating substrate;
    creating a collector layer of n-doped silicon on the isolating substrate;
    creating a base layer of p-doped silicon;
    creating an emitter layer of n-doped silicon;
    forming a silicon oxide layer on the emitter layer;
    creating an n+ polysilicon layer on the oxide layer;
    forming an emitter contact plug by masking and etching the oxide layer and the n+ polysilicon layer;
    masking the emitter layer while maintaining exposure of a top surface of the emitter contact plug;
    depositing a layer of magnesium over the masking and the top surface of the emitter contact plug;
    heating the semiconductor device to form liquid magnesium and magnesium suicide; and
    planarizing the semiconductor device to remove the magnesium above a top surface level of the mask.

3. A method of fabricating a semiconductor device, comprising:
    creating an isolating substrate;
    creating a collector layer of n-doped silicon on the isolating substrate;
    creating a base layer of p-doped silicon;
    creating an emitter layer of n-doped silicon;
    forming a silicon oxide layer on the emitter layer;
    creating an n+ polysilicon layer on the oxide layer;
    forming an emitter contact plug by masking and etching the oxide layer and the n+ polysilicon layer;
    masking the emitter layer while exposing a top surface of the emitter contact plug;
    depositing a layer of magnesium over the masking and the top surface of the emitter contact plug;
    heating the semiconductor device to form liquid magnesium;
    cooling the semiconductor device; and
    planarizing the semiconductor device to remove the magnesium above a top surface level of the mask.

4. The method of claim 3 wherein the semiconductor device is heated to a temperature above 638.6 degrees Celsius.

5. A method of fabricating a semiconductor device, comprising:
    creating an isolating substrate;
    creating a collector layer of a n-doped silicon on the isolating substrate;
    creating a base layer of p-doped silicon;
    creating an emitter layer of n-doped silicon;
    forming an oxide layer on the emitter layer;
    creating an n+ polysilicon layer on the oxide layer;
    replacing the n+ polysilicon layer with aluminum through polysilicon-aluminum substitution processing;
    etching out the aluminum with phosphoric acid, exposing the oxide layer; and
    depositing a low work function material on the oxide layer.

6. A method of fabricating a semiconductor device, comprising:
    providing a substrate;
    forming a collector layer of a first conduction type and of a semiconductor material on the substrate;
    forming a base layer of a second conduction type and of the semiconductor material on the collector substrate;
    forming a masking insulator layer on the base layer;
    forming an emitter opening in the masking insulator layer;
    forming an emitter layer of the first conduction type and of the semiconductor material on the base layer through the emitter opening;

forming an oxide layer on the emitter layer in the emitter opening;

forming a low work function material layer on the oxide layer; and wherein forming the low work function material layer includes forming an n+ polysilicon layer on the oxide layer, replacing the n+ polysilicon with aluminum through polysilicon-aluminum substitution, selectively etching out the aluminum to expose the oxide layer, and depositing a low work function material on the oxide layer.

7. A method of fabricating a semiconductor device, comprising:

providing a substrate;

forming a collector layer of a first conduction type and of a semiconductor material on the substrate;

forming a base layer of a second conduction type and of the semiconductor material on the collector substrate;

forming a masking insulator layer on the base layer;

forming an emitter opening in the masking insulator layer;

forming an emitter layer of the first conduction type and of the semiconductor material on the base layer through the emitter opening;

forming an oxide layer on the emitter layer in the emitter opening; and forming a low work function material layer on the oxide layer, wherein forming the low work function material layer includes forming a contact material layer on the oxide layer, forming a layer of magnesium over the masking insulator layer and the contact material layer, heating the semiconductor device to form liquid magnesium, cooling the semiconductor device, and planarizing the semiconductor device to remove excess magnesium above a top surface of the masking insulator layer.

8. A method of fabricating a semiconductor contact, comprising:

providing a layer of p-doped silicon material;

forming a masking insulator layer on the layer of p-doped silicon material;

forming an opening in the masking insulator layer;

forming a region of n-doped silicon material in the layer of p-doped silicon material through the opening;

forming an oxide layer on the region of n-doped silicon material in the opening;

forming a contact material layer on the oxide layer in the opening;

forming a layer of magnesium over the masking insulator layer and the contact material layer;

heating the semiconductor device to form liquid magnesium; and planarizing to remove excess magnesium above the masking insulator layer.

9. The method of claim 1, wherein heating includes heating to a temperature above 638.6 degrees Celsius.

10. The method of claim 2, wherein heating includes heating to a temperature above 638.6 degrees Celsius.

11. A method of fabricating a homojunction semiconductor device, comprising:

creating an isolating substrate;

creating a collector layer doped to a first conduction type and of a semiconductor material on the isolating substrate;

creating a base layer of the semiconductor material on the collector layer, the base layer doped to a second conduction type;

creating an emitter layer of the semiconductor material on the base layer, the emitter layer doped to the first conduction type;

creating an oxide layer of the semiconductor material on the emitter layer; and forming a material layer on the oxide layer, wherein the material layer consists essentially of a mixture of magnesium and magnesium silicide.

* * * * *

UNITED STATES PATENT AND TRADEMARK OFFICE
CERTIFICATE OF CORRECTION

PATENT NO. : 7,214,616 B2 Page 1 of 1
APPLICATION NO. : 09/795949
DATED : May 8, 2007
INVENTOR(S) : Forbes et al.

It is certified that error appears in the above-identified patent and that said Letters Patent is hereby corrected as shown below:

In column 2, line 26, delete "$P_{no}$" and insert -- $p_{no}$ --, therefor.

In column 5, line 34, delete "$J\alpha e(-q\Phi_{Bn}/E_{oo})$" and insert -- $J \propto e(-q\phi_{Bn}/E_{oo})$ --, therefor.

In column 6, line 39, delete "some" and insert -- Some --, therefor.

In column 8, line 15, in Claim 2, delete "suicide;" and insert -- silicide; --, therefor.

Signed and Sealed this

Third Day of July, 2007

JON W. DUDAS
*Director of the United States Patent and Trademark Office*